United States Patent
Qiu et al.

(10) Patent No.: US 7,501,755 B2
(45) Date of Patent: Mar. 10, 2009

(54) ELECTRON INJECTION LAYER MATERIAL FOR ORGANIC ELECTROLUMINESCENCE DEVICE

(75) Inventors: Yong Qiu, Beijing (CN); Yudi Gao, Beijing (CN); Deqiang Zhang, Beijing (CN); Wang Liduo, Beijing (CN)

(73) Assignees: Tsinghua University, Beijing (CN); Beijing Visionox Technology Co., Ltd., Beijing (CN)

( * ) Notice: Subject to any disclaimer, the term of this patent is extended or adjusted under 35 U.S.C. 154(b) by 372 days.

(21) Appl. No.: 11/192,390

(22) Filed: Jul. 28, 2005

(65) Prior Publication Data

US 2006/0152145 A1    Jul. 13, 2006

(30) Foreign Application Priority Data

Jan. 10, 2005  (CN) .................. 2005 1 0000284

(51) Int. Cl.
*H01J 1/62* (2006.01)
*H01J 63/04* (2006.01)

(52) U.S. Cl. .................. 313/504; 313/498; 313/506

(58) Field of Classification Search .................. 313/498, 313/504, 506
See application file for complete search history.

(56) References Cited

U.S. PATENT DOCUMENTS

| 5,776,622 | A | 7/1998 | Hung et al. | 428/690 |
| 6,806,641 | B2* | 10/2004 | Ueda et al. | 313/506 |
| 2006/0108578 | A1* | 5/2006 | Liu | 257/40 |

* cited by examiner

*Primary Examiner*—Karabi Guharay
*Assistant Examiner*—Kevin Quarterman
(74) *Attorney, Agent, or Firm*—Husch Blackwell Sanders LLP

(57) ABSTRACT

The present invention relates to an organic electroluminescence device and provides a new material composition scheme for an electron injection layer. The organic electroluminescence device of the present invention includes an electron injection layer which contains a material represented by formula $A_xB_yO_z$, wherein A is one of an alkali metal and an alkali earth metal, B is one of group VIII metals and $0<x\leq2$, $0<y\leq3$, $0<z\leq6$. A is selected from one of Li, Na, K, Rb, Cs, Be, Mg, Ca, Sr and Ba. B is selected from one of Fe, Co, Ni, Ru, Rh, Pd, Os, Ir and Pt. The electron injection layer can be formed of Al and $A_xB_yO_z$. The electron injection layer has high electron injection ability, and the device has low threshold voltage, high luminance, high efficiency and long life.

6 Claims, 3 Drawing Sheets

ELECTRON INJECTION LAYER MATERIAL FOR ORGANIC ELECTROLUMINESCENCE DEVICE

TECHNICAL FIELD OF THE INVENTION

The present invention relates to an organic electroluminescence device, and more particularly, to an electron injection layer of an organic electroluminescence device.

BACKGROUND OF THE INVENTION

In an organic electroluminescence device, in order to reduce the operating voltage of the device, the injection of electrons and holes should be balanced. It is needed to improve electron injection ability.

The use of a low work function metal as a cathode can effectively improve electron injection ability. However, the low work function metal is too active and apt to react with water and oxygen.

Another method for improving electron injection ability is to add an electron injection layer formed of an inorganic compound layer between said cathode and an organic layer. It has been proved in practice that LiF/Al is a cathode structure having excellent electron injection ability, which is widely used in OLED products. However, the present of halogen elements may cause quench of light emission.

SUMMARY OF THE INVENTION

One object of the present invention is to provide an electron injection layer having excellent electron injection ability.

According to an aspect of the present invention, an organic electroluminescence device includes an electron injection layer between a cathode and an organic layer, characterized in that the electron injection layer contains a material represented by formula $A_xB_yO_z$, wherein A is one of an alkali metal and an alkali earth metal, B is one of group VIII metals and $0<x\leq2$, $0<y\leq3$, $0<z\leq6$.

Preferably, the electron injection layer has a thickness of 0.5-20 nm.

The alkali metal or alkali earth metal can be selected from one of Li, Na, K, Rb, Cs, Be, Mg, Ca, Sr and Ba.

The group VIII metal can be selected from one of Fe, Co, Ni, Ru, Rh, Pd, Os, Ir and Pt.

The material of the electron injection layer can be $LiNiO_2$.

The material of the electron injection layer can be $LiCoO_2$.

The material of the electron injection layer can be formed of Al and a material represented by formula $A_xB_yO_z$.

The advantageous effects of the organic electroluminescence device according to the present invention include: high efficiency of injecting electrons from a cathode to an organic layer, low operating voltage, high device luminance and efficiency and long device life.

DETAILED DESCRIPTION OF THE PREFERRED EMBODIMENTS

An electron injection layer of the present invention is a layer between a cathode and an organic layer (such as a light-emitting layer or an electron transport layer).

Figure 1:
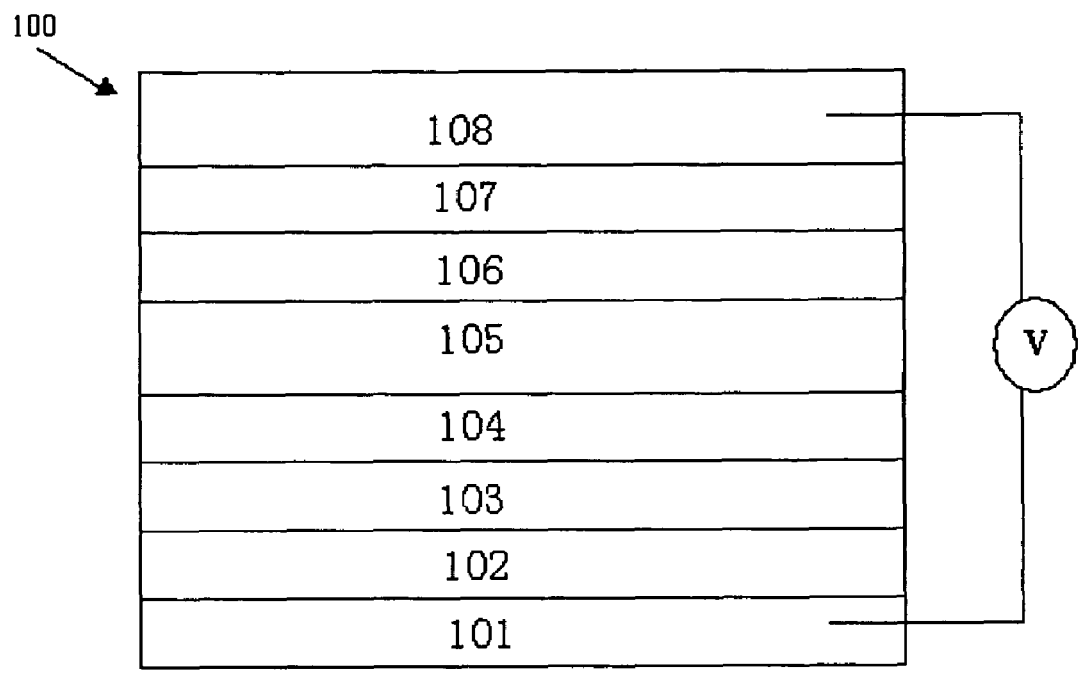
FIG. 1 shows a layer structure of OLED.

As shown in FIG. 1, the constituent and function of layers forming OLED device of FIG. 1 now will be described as follows:

A substrate 101 is used to support other layers of OLED device.

Holes flow from an anode 102 when voltage is applied to the device.

Hole injection layer 103 has a function to improve efficiency of injecting holes from an anode to an organic layer.

Hole transport layer 104 has a function to transport holes to a light-emitting layer 105.

The light-emitting layer 105 provides a place for recombination of electrons and holes, and emits light after recombination.

Electron transport layer 106 has a function to transport electrons to the organic layer.

Electrons flow from a cathode 108 when voltage is applied to the device.

The functions and materials of the layers of OLED device and the preparation process of the same are well known by those skilled in the art, which will not be described in detail herein.

Materials in examples has been described in detail in table 1.

TABLE 1

| $Alq_3$ | 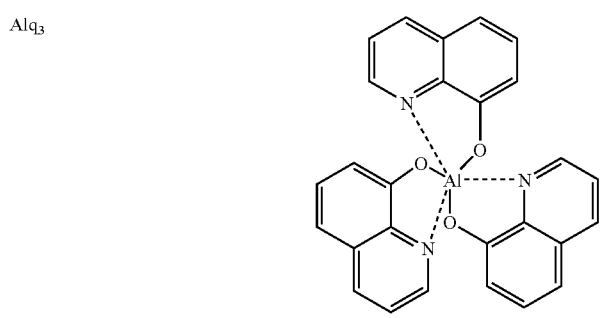 |
| --- | --- |

TABLE 1-continued
NPB
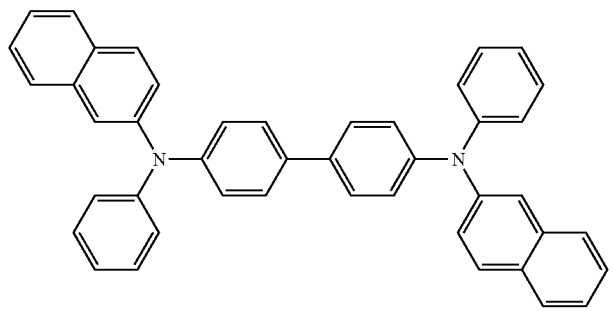
CuPc
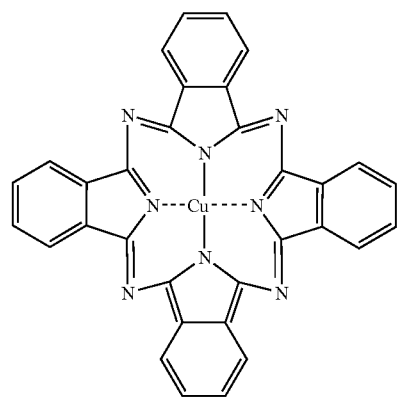
DNTPD
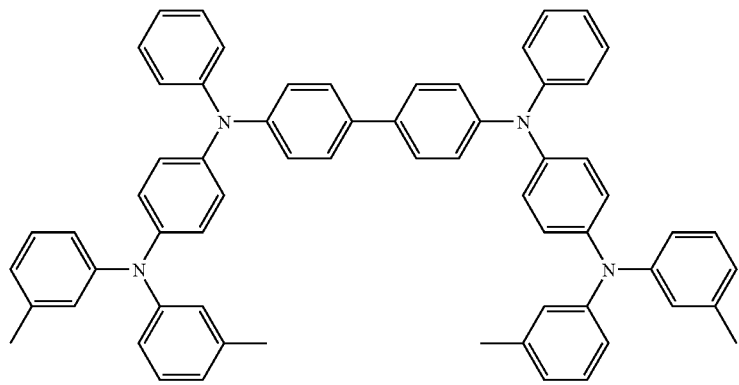
TADN
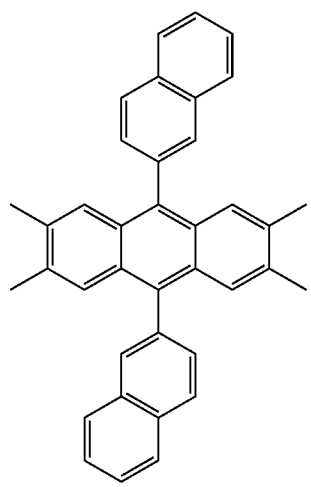

TABLE 1-continued

C545T

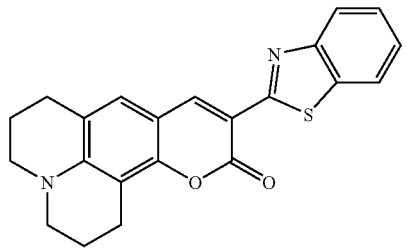

The electron injection layer of the present invention is formed of a material represented by formula $A_xB_yO_z$, $0<x\leq2$, $0<y\leq3$, $0<z\leq6$. The electron injection layer formed of the material can be evaporated on the light-emitting layer 105 or the electron transport layer 106. Preferably, it has a thickness of 0.5-20 nm. If the thickness is less than 0.5 nm, it is not easy to form the electron injection layer film. If the thickness is more than 20 nm, the effect of injecting electrons may be reduced. It should be understood that it is useable with other thicknesses. A group VIII element is a very important transition metal element, the total electron number of outermost shell s and inner shell d of which is more than or equal to 8. Due to this special electron arrangement, the group VIII element has a feature of valence alternation. Therefore, the mixed oxide of the group VIII element and an alkali metal or an alkali earth metal has higher electron injection and conducting ability.

It should be understood for those skilled in the art that it is preferred to use the implementation of the layer structure of OLED shown in FIG. 1, but the device can also be prepared without using the hole injection layer 103, the hole transport layer 104 and the electron transport layer 106. The concept of the present invention is to add an electron injection layer formed of a material represented by formula $A_xB_yO_z$ between a cathode and an organic layer. Although the present invention has been described in conjunction with the preferred embodiment, the invention is not limited to the above embodiment and drawings. It should be understood that various modifications and improvements can be made by those skilled in the art under the instruction of the concept of the invention. The scope of the invention is defined by the appended claims.

EXAMPLE 1

ITO/CuPc(15 nm)/NPB(60 nm)/TADN(40 nm)/Alq$_3$(10 nm)/LiCoO$_2$(0.7 nm)/Al(150 nm)

(1) Cleaning of a Glass Substrate Pre-provided with a ITO:

A transparent conductive substrate ITO glass is cleaned by thermal detergent ultrasonic and deionized water ultrasonic methods, and then dried under an infrared lamp. Then, the dried ITO glass is preprocessed by ultraviolet ozone cleaning and low energy oxygen ion beam bombardment, wherein the ITO film on the conductive substrate is used as an anode layer. The square resistance of the ITO film is 50Ω, and the thickness of the ITO film is 150 nm.

(2) Preparation of an Organic Layer:

The cleaned, dried and preprocessed ITO film is placed in a vacuum cavity which is pumped to $1\times10^{-3}$ Pa. A CuPc film of 15 nm is evaporated in a evaporation rate of 0.05 nm/s. Then, a layer of hole transport material NPB of 60 nm is evaporated on the CuPc film in a evaporation rate of 0.3 nm/s.

On the hole transport layer, a TADN of 40 nm is evaporated for a light-emitting layer, and a Alq$_3$ of 10 nm is evaporated for an electron transport layer.

(3) Preparation of an Electron Injection Layer:

After evaporating the electron transport layer, LiCoO$_2$ of 0.7 nm is evaporated in a evaporation rate of 0.04 nm/s for an electron injection layer.

(4) Preparation of an Cathode:

In the light-emitting device, the cathode is formed of Al film of 150 nm. The evaporation rate of Al layer is 0.2 nm/s.

(5) Packaging with Glass Package Sheets.

COMPARATIVE EXAMPLE 1

ITO/CuPc(15 nm)/NPB(60 nm)/TADN(40 nm)/Alq$_3$(10 nm)/LiF(0.7 nm)/Al(150 nm)

The preparation steps are the same with Example 1, but after the electron transport layer, LiF of 0.7 nm is evaporated.

EXAMPLE 2

ITO/CuPc(15 nm)/NPB(60 nm)/Alq$_3$(30 nm):C545T [1%]/Alq$_3$(20 nm)/LiNiO2(0.5 nm)/Al(150 nm)

The preparation procedure is referred to Example 1.

COMPARATIVE EXAMPLE 2

ITO/CuPc(15 nm)/NPB(60 nm)/Alq$_3$(30 nm):C545T [1%]/Alq$_3$(20 nm)/LiF(0.5 nm)/Al(150 nm)

The preparation procedure is referred to Example 1.

EXAMPLE 3

ITO/CuPc(15 nm)/NPB(60 nm)/Alq$_3$(40 nm)/Al(20 nm): LiCoO$_2$[10%]/Al(120 nm) Al(20 nm):LiCoO$_2$[10%]

A mixed electron injection layer of Al and LiCoO$_2$ of 20 nm is prepared by a double source co-evaporation method. The evaporation rate of the layer is 0.1 nm/s, and the dopant concentration of LiCoO$_2$ is controlled to 10%.

Other preparation steps are referred to Example 1.

Figure 2:
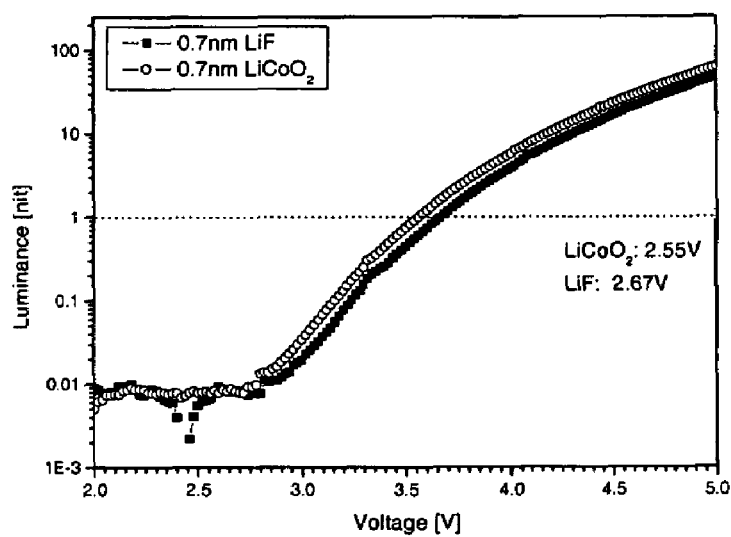
FIG. 2 is a graph illustrating threshold voltage of Example 1 and Comparative Example 1.

It can be seen from FIG. 2 that voltage of LiF device of Comparative Example 1 and LiCoO$_2$ device of Example 1 is 2.67 v and 2.55 v at luminance of 1 cd/m$^2$, respectively.

Figure 3:
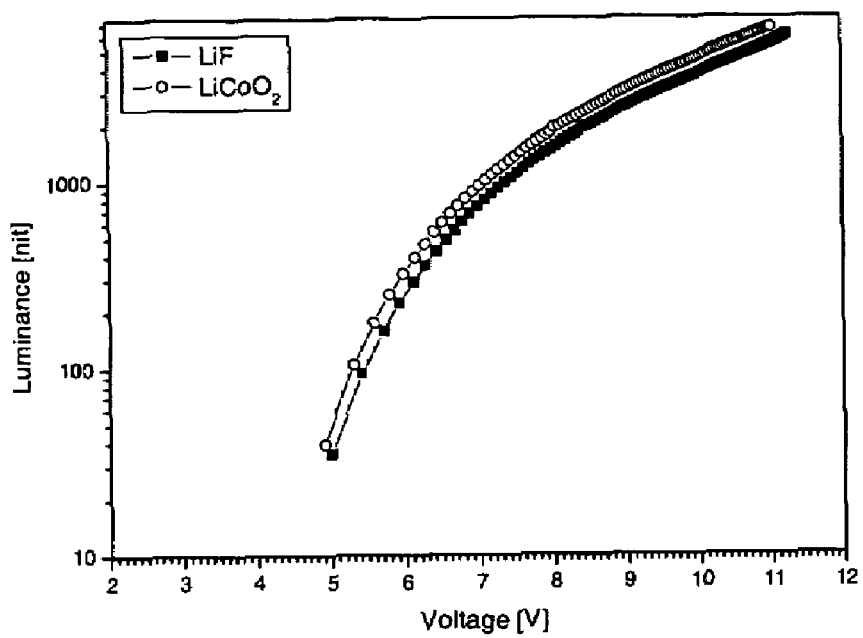
FIG. 3 is a graph illustrating luminance v. voltage of Example 1 and Comparative Example 1.

It can be seen from FIG. 3 that luminance of LiCoO$_2$ device of Example 1 is higher than that of LiF device of Comparative Example 1 at the same voltage.

Figure 4:
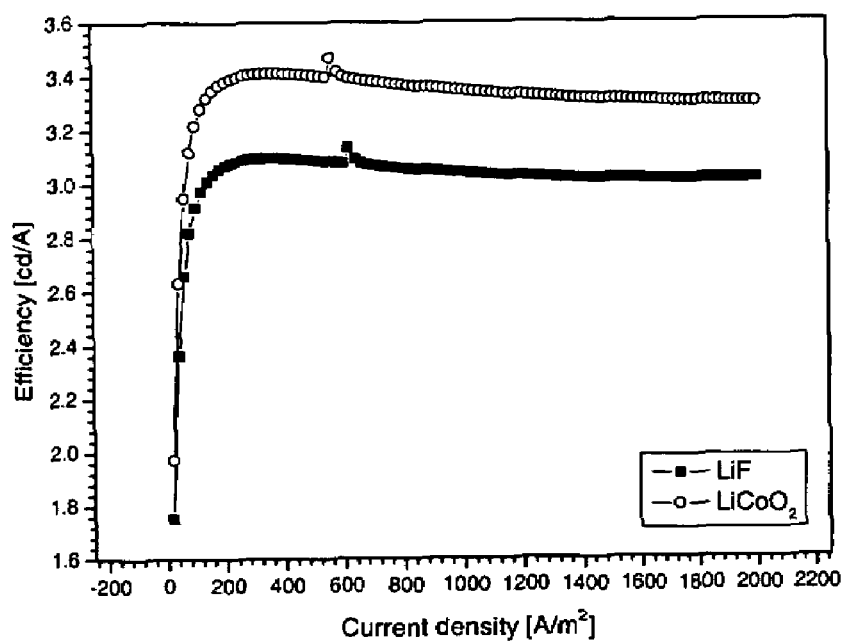
FIG. 4 is a graph illustrating efficiency v. current density of Example 1 and Comparative Example 1.

It can be seen from FIG. 4 that efficiency of LiCoO$_2$ device of Example 1 is higher than that of LiF device of Comparative Example 1.

Figure 5:
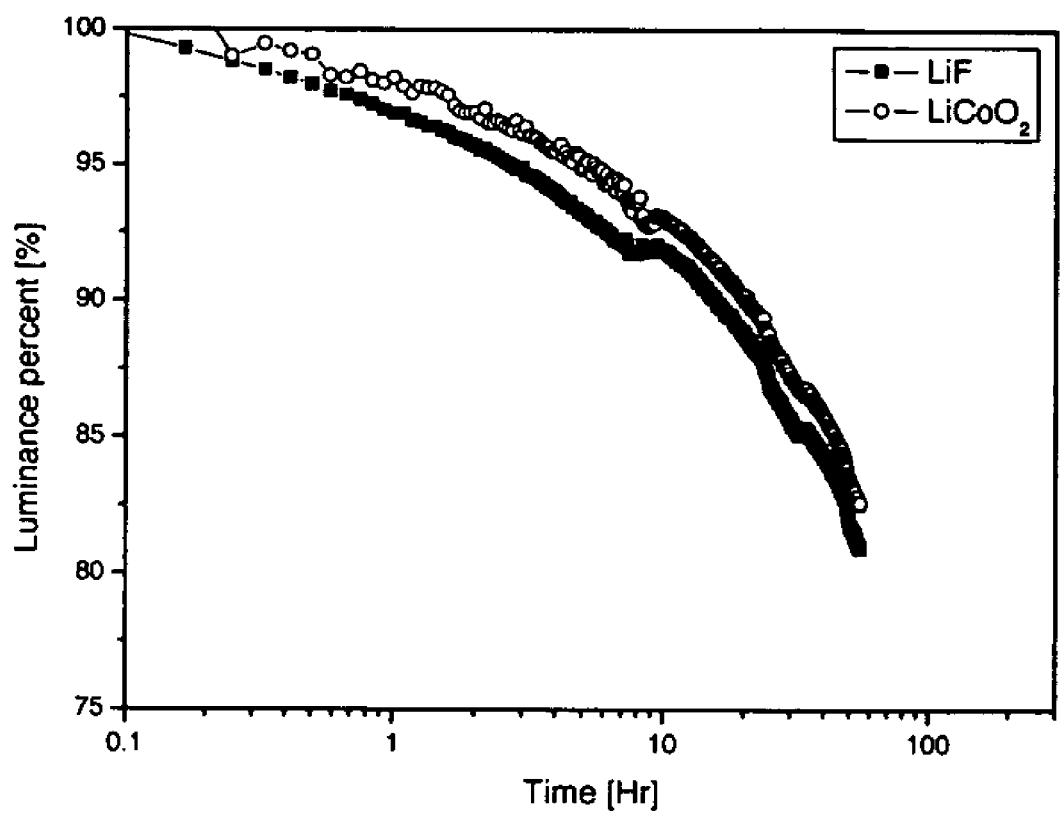
FIG. 5 is a graph illustrating life of Example 1 and Comparative Example 1.

It can be seen from FIG. 5 that life of LiCoO$_2$ device of Example 1 is higher than that of LiF device of Comparative Example 1.

| Device | Wavelength of light emission | Efficiency (5 mA/cm$^2$) | Life (1000 nit) |
| --- | --- | --- | --- |
| Example 2 | 520 nm | 11.5 cd/A | 4500 hours |
| Example 3 | 520 nm | 12.1 cd/A | 5000 hours |
| Comparative Example 2 | 520 nm | 11.5 cd/A | 4000 hours |

It can be seen from the table that efficiency and life of $LiCoO_2$:Al device of Example 3 are better than that of $LiNiO_2$ device of Example 2, and efficiency and life of $LiNiO_2$ device of Example 2 are better than that of LiF device of Comparative Example 1.

The invention claimed is:

1. An organic electroluminescence device comprising an electron injection layer between a cathode and an organic layer, wherein the electron injection layer contains a material represented by formula $A_xB_yO_z$ and Al, wherein A is one of an alkali metal and an alkali earth metal, B is one of group VIII metals and $0<x\leqq2$, $0<y\leqq3$, $0<z\leqq6$.

2. The organic electroluminescence device according to claim 1, wherein the electron injection layer has a thickness of 0.5-20 nm.

3. The organic electroluminescence device according to claim 1, wherein A is selected from one of Li, Na, K, Rb, Cs, Be, Mg, Ca, Sr and Ba.

4. The organic electroluminescence device according to claim 1, wherein B is selected from one of Fe, Co, Ni, Ru, Rh, Pd, Os, Ir and Pt.

5. The organic electroluminescence device according to claim 1, wherein $A_xB_yO_z$ is $LiNiO_2$.

6. The organic electroluminescence device according to claim 1, wherein $A_xB_yO_z$ is $LiCoO_2$

* * * * *